United States Patent [19]
Christopher

[11] Patent Number: 5,543,724
[45] Date of Patent: Aug. 6, 1996

[54] METHOD AND APPARATUS FOR LOCATING CONDUCTIVE FEATURES AND TESTING SEMICONDUCTOR DEVICES

[75] Inventor: Gary L. Christopher, Fox River Grove, Ill.

[73] Assignee: Motorola, Inc., Schaumburg, Ill.

[21] Appl. No.: 317,094

[22] Filed: Oct. 3, 1994

[51] Int. Cl.⁶ ................................. G01R 1/04
[52] U.S. Cl. .................. 324/754; 324/72.5; 324/158.1
[58] Field of Search ................... 324/754, 72.5, 324/158.1

[56] References Cited

U.S. PATENT DOCUMENTS

| | | | |
|---|---|---|---|
| 3,806,800 | 4/1974 | Boue | 324/754 |
| 4,477,774 | 10/1984 | Revirieux | 324/72.5 |
| 4,870,356 | 9/1989 | Tingley | 324/754 |
| 5,367,253 | 11/1994 | Wood | 324/158.1 |

OTHER PUBLICATIONS

Grove, Z–Axis Adhesive Film: Innovation in Electronic Interconnection, Interconnection Technology, Dec. 1992, p. 35.

Hogerton, Development Goals and Present Status of 3M's Adhesive Interconnection Technology, Journal of Electronics Manufacturing (1993) 3, 191–197.

*Primary Examiner*—Kenneth A. Wieder
*Assistant Examiner*—M. Wardas
*Attorney, Agent, or Firm*—Aaron B. Bernstein; George C. Chen

[57] ABSTRACT

A system for locating electrically conductive features such as device terminals (104) of a semiconductor die device under test (103) includes an array of test terminals (101), an anisotropically conductive material (102) above the array of test terminals (101), and a semiconductor die (103). The array of test terminals has a pitch (203) much smaller than the pitch (204) of the device terminals (104). Individual test terminals (105) of the array of test terminals (101) are scanned to locate the device terminals (104). Once the device terminals (104) are located, the test terminals (105) are configured to send and receive functional signals required for functionally testing the device under test (103).

10 Claims, 3 Drawing Sheets

METHOD AND APPARATUS FOR LOCATING CONDUCTIVE FEATURES AND TESTING SEMICONDUCTOR DEVICES

BACKGROUND OF THE INVENTION

This invention relates, in general, to locating and testing semiconductor devices, and more specifically to locating conductive features of a semiconductor device without the need for precise alignment.

Manufacturers of semiconductor devices, including devices formed as small semiconductor die, must test these devices for functionality and durability at the end of the manufacturing process. As electronic devices such as semiconductor die become smaller, they become more difficult to test. The difficulty is due in large part to the fact that as the devices become smaller the device terminals, such as pads or electrically conductive bumps on the underside of the die, become smaller and more closely spaced. Conventionally, in order to test such devices, a "bed-of-nails" tester configuration is employed. The bed-of-nails tester includes an array of tiny pins corresponding to the array of device terminals on the die. These tiny pins provide the test signals to the semiconductor device. Consequently, the pins of the bed-of-nails must be carefully and precisely aligned to correspond to the array of device terminals. Furthermore, the bed-of-nails type tester is inherently very delicate and prone to damage and misalignment.

Other test methods for testing semiconductor devices in the form of die (or a wafer full of die) include using an array of test terminals which provide the test signals, laid out on a flexible printed circuit membrane. Like the tiny pins in the bed-of-nails configuration, the test terminals laid out on the flexible printed circuit membrane must precisely match the terminals on the die in order to make contact to the device terminals during testing. Additionally, in both the bed-of-nails type system and the system with test terminals laid out on a printed circuit, the semiconductor device must be precisely aligned with the test fixture so that the device terminals touch the test terminals or pins.

The conventional methods described require extremely precise alignment between the device under tests and the test fixture, during testing. Furthermore, the conventional systems described tend to be extremely delicate and prone to damage and misalignment. Consequently, what is needed is a test system which can accurately bring test signals to the device terminals, irrespective of the alignment of the die and the test fixture. Furthermore, what is needed is a system which is robust, and not prone to misalignment or damage.

DETAILED DESCRIPTION OF THE DRAWINGS

Generally, one primary problem present in the context of testing semiconductor devices with small device terminal geometries is the problem of aligning the device to the test terminals of the test fixture. A system in accordance with the present invention provides a method whereby small device geometries are not an issue and precise part alignment is not necessary. The system and method in accordance with the present invention uses no moveable fixturing for alignment, no moveable contact pins, is capable of detecting missing or inadequate device terminals, and only requires simple, imprecise placement of a device within the boundaries of a testing surface. The test method in accordance with the present invention will automatically locate device terminals, determine device orientation on the testing surface, run a test program to determine device functionality, and pass or reject the device.

Figure 1:
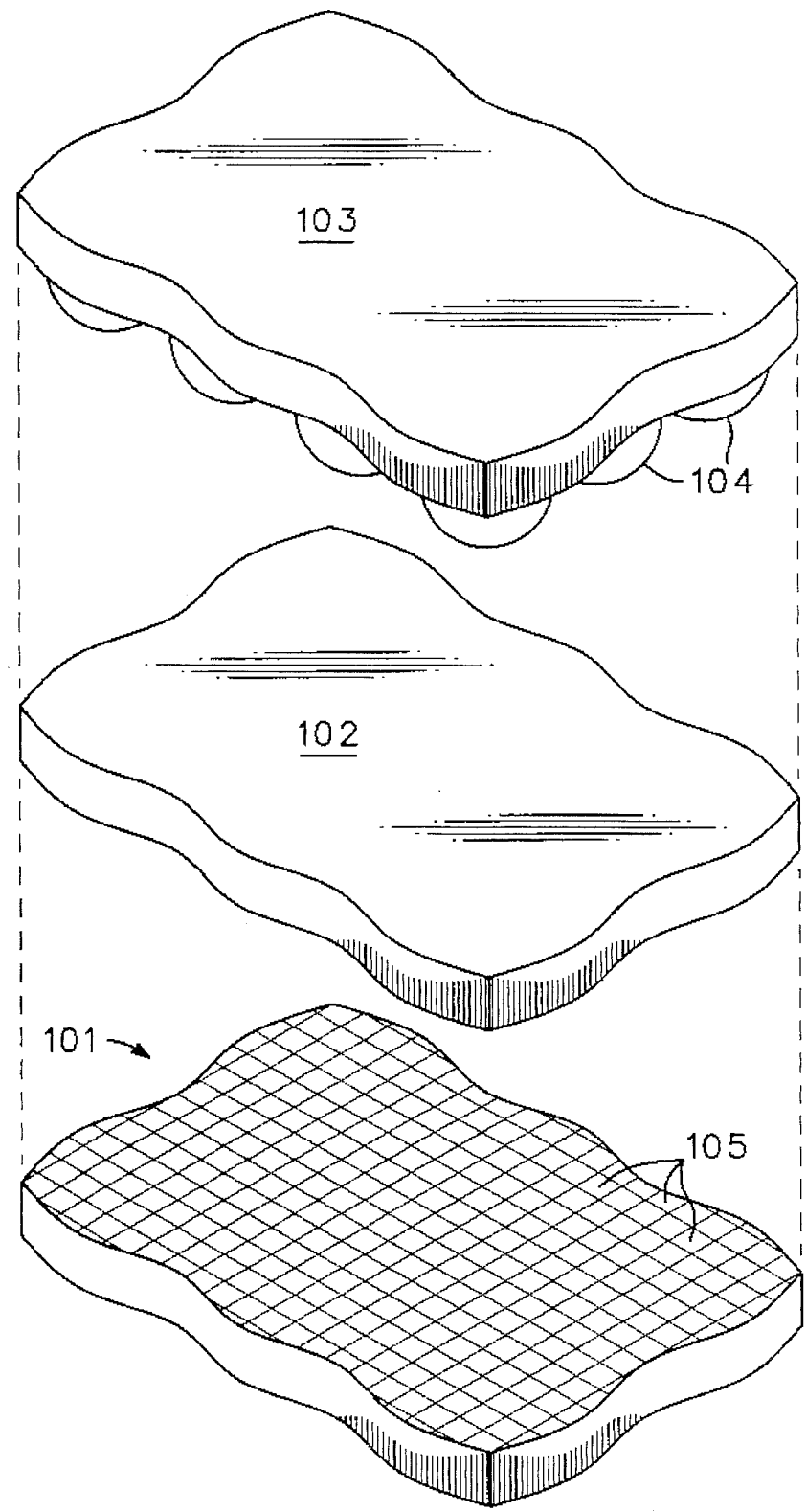
FIG. 1 is an exploded perspective partial view representing the main components of a semiconductor die device test system.

Turning to the figures for a better understanding of the present invention, FIG. 1 shows a portion of test terminal array 101, a portion of an anisotropically conductive material 102 and a portion of a semiconductor die 103 which is the device under test. Semiconductor die 103 includes an array of device terminals 104 which are electrically conductive bumps, such as solder bumps or plated bumps.

The individual squares shown on the surface of test terminal array 101 are individual test terminals 105. Each of these individual test terminals are electrically isolated from one another.

An important feature of the described system is anisotropically conductive material 102 (discussed in more detail below). Anisotropically conductive material 102 has the characteristic that when it is compressed it conducts current only in the direction of compression. Material 102 is a compliant elastomer.

Figure 2:
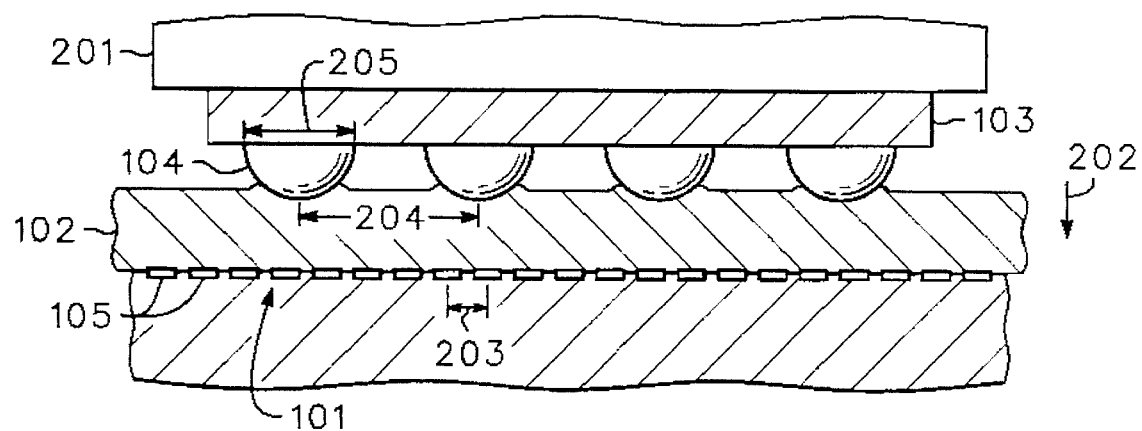
FIG. 2 is a cross-sectional side view of the system of FIG. 1.

Turning to FIG. 2, FIG. 2 is a side view partial cross-section illustrating the system that is shown in FIG. 1. FIG. 2 illustrates test terminal array 101 and individual test terminals 105. Overlying test terminal array 101 is anisotropically conductive material 102. Pressed against material 102 are device terminals 104 of semiconductor die device 103. A hold down plate 201 presses die 103 against material 102.

FIG. 2 illustrates the important function of compliant anisotropically conductive material 102. It will be recognized by those skilled in the art that device terminals such as terminals 104, or terminal pads or other terminal configurations, are rarely perfectly planar. Consequently, if device 103 was pressed directly against array 101, some of the terminals 104 might not make contact. Compliant anisotropically conductive material 102 compensates for any non-planarities of device terminals 104. It should be noted that other mechanisms could be employed for height compensation. For example, test terminals 105 could comprise compliant pads or bumps themselves, eliminating the need for material 102.

As mentioned above, material 102 has the characteristic of conducting current only in the direction in which it is compressed. Material 102 is essentially an elastomer consisting of conductive particles suspended in a non-conductive polymer matrix. When force is applied causing compression in the "Z" direction, indicated by the arrow 202, the conductive particles make contact. This causes the material to become conductive only in the Z-axis. The conductivity of the material is directly related to the force applied. Such materials are known in the industry as Z-Axis Films (ZAF). One example of such a ZAF is available from 3M Electronic Products Division, Austin, Tex. The 3M ZAF is reported to be capable of conducting current anisotropically (along only one axis, that of compression) provided that terminals contacting one side of the ZAF do not have center-to-center spacing (pitch) less than 100 μm (0.004"). Further details of ZAF technology and characteristics may be found in, Grove, "Z-Axis Adhesive Film: Innovation in Electronic Interconnection", Interconnection Technology, December 1992, Page 35, Yoshigahara et al, "Anisotropic Adhesives for Advanced Surface Mount Interconnection" Hogerton, "Development Goals and Present Status of 3M's Adhesive Interconnection Technology", Journal of Electronic Manufacturing (1993) 3, 191–197 and Hogerton et al., "An Evaluation of a Heat-Bondable, Anisotropically-Conductive Adhesive as an Interconnection Medium for Flexible Printed Circuitry", each of which is incorporated herein by reference.

Test terminals 105 are spaced apart with a particular test terminal pitch 203 (center-to-center spacing of the pads) which is wider than the smallest pitch that the anisotropically conductive material 102 can accommodate, such that shorts will not occur between two adjacent test terminals. Furthermore, pitch 203 is small enough so that at least two test terminals 105, and in some preferred embodiments at least three test terminals, lie beneath any device terminal 104. Preferably, test terminal pitch 203 is less than or equal to one third of device terminal pitch (center to center spacing of the device terminals) 204. Furthermore, preferably, the diameter 205 of device terminal 104 is two to three times or greater than test terminal pitch 203.

Figure 3:
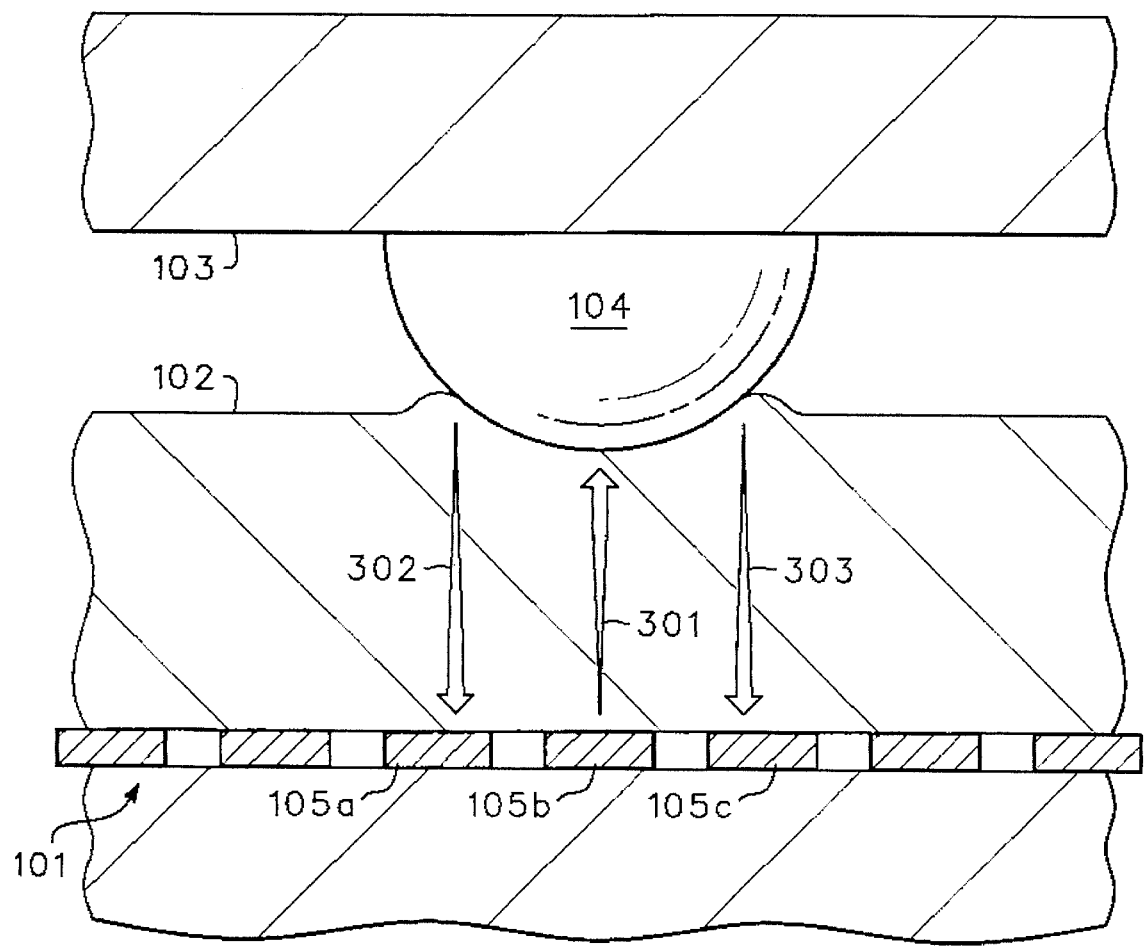
FIG. 3 is a cross-sectional side view magnifying a portion of FIG. 2.

Turning to FIG. 3 for further understanding of the operation of the test system, FIG. 3 illustrates test terminal array 101 including individual test terminals 105a, 105b and 105c, anisotropically conductive material 102, device terminal 104 and semiconductor die device 103. In the embodiment illustrated three test terminals 105 lie beneath device terminal 104. During operation, a test signal is scanned from one test terminal 105 to another while adjacent terminals are sensed for the test signal. When the test signal is sent to a test terminal under the device terminal, for example test terminal 105b, it will be channeled directly upward through anisotropically conductive material 102, in the direction indicated by arrow 301. Recall that anisotropically conductive material 102 can only support current along the axis of compression, i.e. toward device terminal 104. Consequently, the signal travels in the direction indicated by arrow 301 and is not shorted through material 102 to adjacent terminals 105a and 105c. Nevertheless, when the signal reaches device terminal 104, it is channeled back through material 102 directly down to test terminals 105a and 105c along paths indicated by arrows 302 and 303, respectively. Each device terminal 104 of semiconductor die device 103 can thereby be located by scanning a test signal from one test terminal to another while sensing adjacent test terminals. The controlling of scanning, providing of signals and sensing for signals may all be implemented with methods and electronic systems (computers and the like described in more detail below) currently available and well known in the art.

In this manner, every device terminal 104 may be located (found) on test terminal array 101 (see FIG. 1). Typically, device terminals 104 are asymmetrically distributed across semiconductor die device 103. The computer controlling the test operation may be preprogrammed with the particular layout of the particular semiconductor die device under test 103. Consequently, when all device terminals 104 are located across test terminal array 101 (see FIG. 1), each device terminal 104 may be uniquely identified. Once each device terminal is located and its function is identified, test terminal array 101 is configured to either send or receive signals through the appropriate test terminals 105 under respective device terminals 104 so as to perform the required post fabrication functionality testing of the device 103.

It will additionally be recognized, in view of the present discussion, that the test system described may be used to locate any electrically conductive feature on a substrate which is pressed against material 102. Consequently, another useful application of the inventive subject matter is to locate an electrically conductive fiducial feature (registration mark) on any substrate. Therefore the location of that substrate relative to the text fixture which includes the test terminal array may be exactly determined. For example, referring to FIG. 3, an electrically conductive fiducial feature (represented by terminal 104) is formed on a semiconductor wafer (represented by die 103). The wafer is then brought into contact with conductive material 102 and the scanning described above is conducted. When two such fiducial features 104 are provided, the precise location and orientation of the semiconductor wafer 103 can be determined. Consequently, the subject matter of the present invention has broad applicability in any situation where the orientation and position of a substrate must be determined. Examples include die level testing, wafer level testing, and photolithography.

Furthermore, it is important to note that the use of ZAF in the test system described particularly enables testing devices with poor terminal coplanarity. However, ZAF would not be required in certain instances. For example, a ZAF would not be required where device terminals are polished to virtual planarity, or where device terminals are resilient (e.g. silver filled silicone rubber), or formed on a compliant material/surface. In these instances, the device terminals can make planar contact directly to array 101, eliminating the need for ZAF 102.

Figure 4:
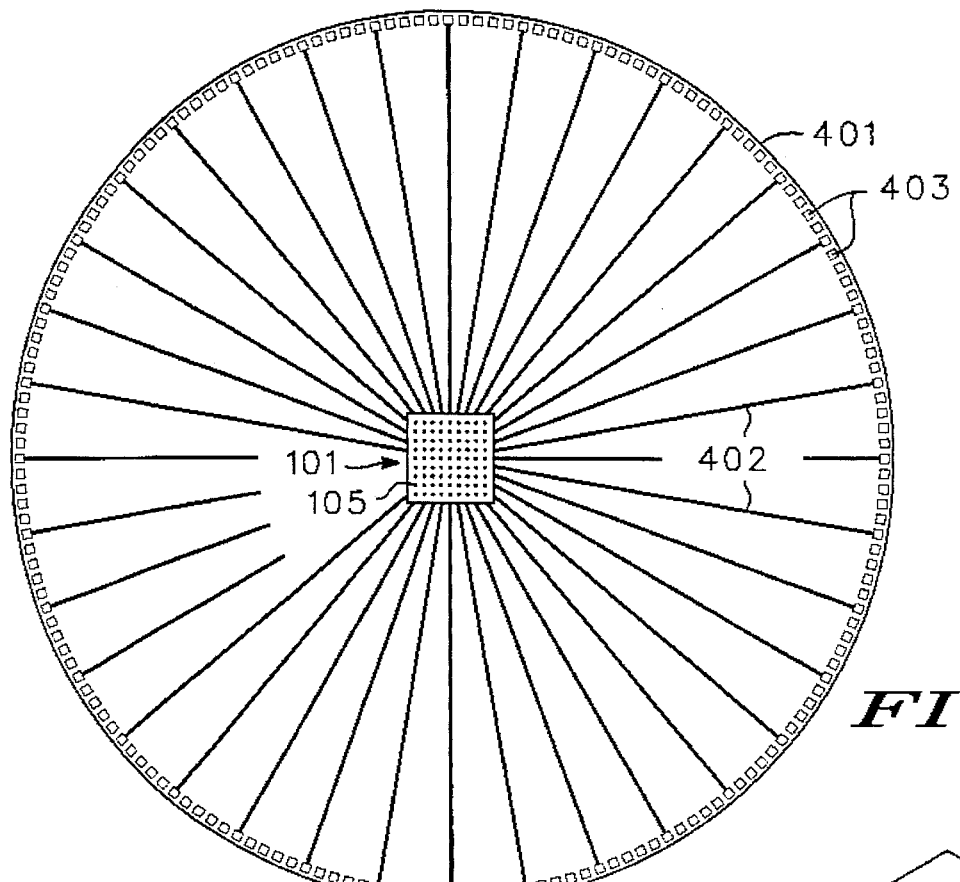
FIG. 4 is a top view illustrating one embodiment of an array of test terminals.

Turning to FIG. 4, FIG. 4 illustrates one embodiment and implementation of test terminal array 101. More specifically, FIG. 4 illustrates a semiconductor wafer 401. Test terminal array 101 is patterned at the center of semiconductor wafer 401 using conventional photolithography techniques. Furthermore, traces 402 are patterned on wafer 401 in order to provide electrical connection from each test terminal 105 of array 101 to external equipment. Traces 402 terminate at the edge of wafer 401 in pads 403. External equipment may be wire bonded to pads 403. Accordingly, patterned wafer 401 provides a convenient means for implementing test terminal array 101 such that test signals may be scanned across terminals 105 of array 101 to locate the device terminals 104, and other functional test signals may be coupled to particular terminals 105 once the location of each device terminal of the device under test 103 is identified. One particular advantage provided by wafer 401, is that it has the same temperature coefficient of expansion as the device under test, assuming they both comprise the same semiconductor material. Consequently, temperature changes either induced or encountered by the device under test and test system will not result in misalignment.

Figure 5:
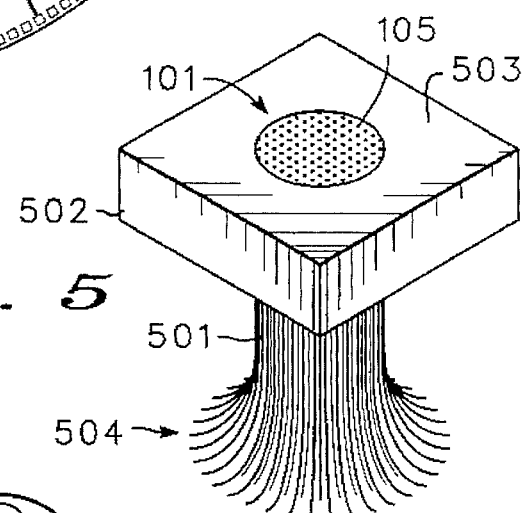
FIG. 5 is a perspective view illustrating a second embodiment of an array of test terminals.

Turning to FIG. 5, FIG. 5 illustrates another embodiment and implementation of test terminal array 101. More specifically, the embodiment of FIG. 5 comprises a bundle of wire bond wires 501 which are much smaller diameter than a typical device terminal. Wire bundle 501 is embedded in molded epoxy block 502. Top surface 503 of molded epoxy block 502 is ground and polished, exposing a smooth polished surface of adjacent wire cross sections. Each individual wire cross section forms a test terminal 105. Tails 504 of the wires of wire bundle 501 are connected to external equipment in order to accomplish the test terminal scanning, and to provide and receive functional signals once the location of device terminals are determined. Typically, each wire of the wire bundle 501 is coated with an insulator to prevent wire-to-wire (i.e. terminal-to-terminal) short circuits.

Figure 6:
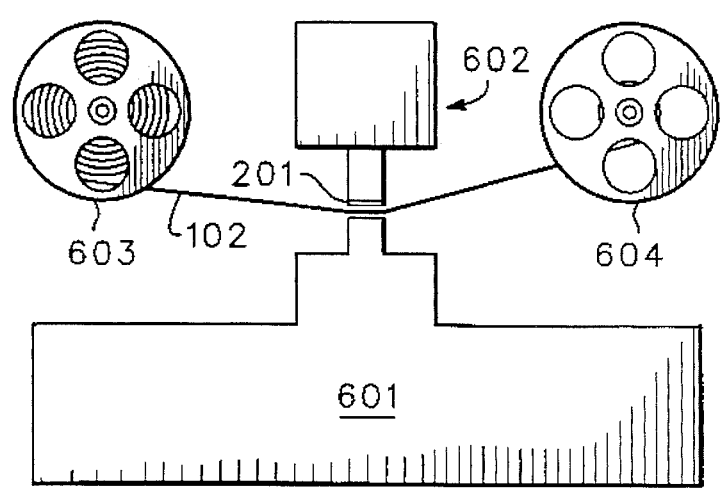
FIG. 6 is a side view representing a test system including a material refresh feature.

Turning to FIG. 6, FIG. 6 shows schematically an overall view of a system in accordance with the present invention, including a ZAF film refresh feature. More specifically, FIG. 6 illustrates switch matrix 601, also including necessary computer hardware, software and electronic control for the system. As discussed above, the switch matrix 601 applies a voltage to one of the test terminals 105 (see FIGS. 2,3) causing it to become a voltage source test terminal, while simultaneously configuring other test terminals 105 surrounding the source as voltage measurement test terminals. Each test terminal 105 in the array is successively made a voltage source test terminal while the test terminals surrounding it are made measurement terminals. When a device terminal (or conductive fiducial registration mark) 104 is above a source test terminal, the voltage is measured on the surrounding test terminals will be nearly as high as that of the source test terminal because current is carried through the ZAF 102 to the device terminal 104, and back through the ZAF 102 to an adjacent measurement terminal. If there is no terminal (conductive fiducial mark) 104 above a source test terminal, the voltage measured on the surrounding measurement test terminals will be very low or zero.

Other electronic control and computer hardware and software associated with switch matrix 601 employs conventional pattern recognition and other well understood software to determine the coordinates and the centers of all device terminals 104. As mentioned above, the pattern of expected device terminal 104 layout is preprogrammed. If the correct device terminal pattern is not detected on the device under test 103, the part may be rejected. Rejection also occurs if a device terminal is mislocated, malformed or has the wrong dimensions. Once the device terminals 104 are located, device under test 103 is subjected to functional tests. Several adjacent test terminals 105 are at that point used together for greater current carrying capacity. As with device terminal locating procedures, during functional testing some of the test terminals 105 are configured as source test terminals while others are configured as measurement test terminals. To confirm proper functional test program operation and provide feedback while each source test terminal is powered, a measurement test terminal may be configured near each source test terminal.

FIG. 6 additionally illustrates mechanical force applicator 602 which manipulates hold down plate 201. Additionally, in certain cases material 102 may need to be replenished or refreshed if it is of the type that wears and has a limited lifetime (loses effectiveness after a number of compressions). Consequently, feed reel 603 is provided to supply new material 102 and take up reel 604 is provided to receive spent material 102. The reels are turned periodically, as necessary, to supply fresh material for the test system. This process, of course, may be automated in coordination with the rest of the system procedures.

It will be recognized that a new and improved test system is provided which can accurately locate device terminals of a device under test such as a semiconductor die. Additionally, the system can bring test signals to the device terminals. The system functions irrespective of the alignment of the die and the test fixture. Furthermore, the system is robust, and not prone to misalignment or damage.

While specific illustrative embodiments of the present invention have been shown and described, further modifications and improvements will occur naturally to those skilled in the art. Consequently, it should be understood that this invention is not limited to the particular embodiments shown, rather it is intended that the appended claims cover all modifications that do not depart from the spirit and scope of this invention.

I claim:

1. A semiconductor device test system comprising:

a test terminal array comprising a plurality of test terminals which are stationary relative to the test terminal array;

an anisotropically conductive material overlying the test terminal array;

a device under test pressed against the anisotropically conductive material, the device under test including a device terminal array comprising a plurality of device terminals; and a switch matrix switching a test signal from one of the plurality of test terminals to another, the semiconductor device test system locating a particular one of the plurality of device terminals when the test signal is channeled to the particular one of the plurality of device terminals without requiring alignment of the device under test to the test terminal array.

2. The semiconductor device test system of claim 1, wherein the particular one of the plurality of device terminals is located when the test signal is channeled from a first one of the plurality of test terminals, through the particular one of the plurality of device terminals, and to a second one of the plurality of test terminals adjacent to the first one of the plurality of test terminals.

3. The semiconductor device test system claim 1, wherein the test terminal array is disposed on a semiconductor substrate.

4. The semiconductor device test system of claim 1, wherein the test terminal array comprises a bundle of wire bond wires.

5. The semiconductor device test system of claim 1, wherein the test terminal array has a test terminal pitch and the device terminal array has a device terminal pitch, and wherein the test terminal pitch is less than or equal to one third of the device terminal pitch.

6. The semiconductor device test system of claim 1, wherein the plurality of device terminals comprise electrically conductive bumps.

7. A method for testing a semiconductor device comprising:

providing a test terminal array comprising a plurality of test terminals spaced at a first pitch, wherein the position of the plurality of test terminals remains fixed relative to the position of the test terminal array;

providing an anisotropically conductive material overlying the test terminal array;

providing a semiconductor device comprising a plurality of device terminals spaced at a second pitch which is greater than or equal to three times the first pitch;

contacting the anisotropically conductive material with the plurality of device terminals on a side of the anisotropically conductive material opposite the test terminal array, wherein relative alignment of the test terminal array and the plurality of device terminals is not needed; and wherein at least three of the plurality of test terminals underlie each of the plurality of device terminals.

8. The method of claim 7, further comprising providing a semiconductor substrate having the test terminal array.

9. The method of claim 7, further comprising providing a bundle of wires for the test terminal array.

10. A method for testing an electronic device comprising:

providing a test terminal array comprising a plurality of test terminals, wherein the plurality of test terminals does not move relative to the test terminal array;

providing a device under test comprising a plurality of device terminals;

temporarily contacting the test terminal array with the plurality of device terminals without requiring alignment of the test terminal array to the plurality of device terminals;

switching a test signal from one of the plurality of test terminals to another; and locating a particular one of the plurality of device terminals when the test signal is channeled to the particular one of the plurality of device terminals.

* * * * *